United States Patent
Sugawara et al.

(10) Patent No.: US 7,254,081 B2
(45) Date of Patent: Aug. 7, 2007

(54) SEMICONDUCTOR MEMORY DEVICE

(75) Inventors: Hiroshi Sugawara, Kanagawa (JP); Kazuo Watanabe, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/274,220

(22) Filed: Nov. 16, 2005

(65) Prior Publication Data

US 2006/0104131 A1 May 18, 2006

(30) Foreign Application Priority Data

Nov. 17, 2004 (JP) ............................. 2004-333761

(51) Int. Cl.
*G11C 11/00* (2006.01)

(52) U.S. Cl. ................... 365/226; 365/230.06
(58) Field of Classification Search ................ 365/226, 365/230.06
See application file for complete search history.

(56) References Cited

U.S. PATENT DOCUMENTS 6,873,561 B2 * 3/2005 Ooishi ..................... 365/226
2001/0024384 A1 * 9/2001 Arimoto et al. ............ 365/200
2002/0130341 A1 * 9/2002 Horiguchi et al. .......... 257/296
2004/0080481 A1 * 4/2004 Yamazaki et al. ........... 345/92

FOREIGN PATENT DOCUMENTS

| JP | 7-169282 | 7/1995 |
| JP | 2000-113689 | 4/2000 |

* cited by examiner

*Primary Examiner*—Micheal Tran
(74) *Attorney, Agent, or Firm*—McGinn IP Law Group, PLLC

(57) ABSTRACT

A semiconductor memory device has: a word driver configured to apply a driving voltage to a word line connected to a memory cell; and an internal power supply circuit configured to supply the driving voltage to the word driver and to apply a substrate voltage to back gates of transistors included in the word driver. The internal power supply circuit controls the driving voltage and the substrate voltage independently of each other. In a read operation, the internal power supply circuit constantly supplies the substrate voltage, while turns on and off supply of the driving voltage.

15 Claims, 11 Drawing Sheets

SEMICONDUCTOR MEMORY DEVICE

BACKGROUND OF THE INVENTION

1. Field of the Invention

The present invention relates to a semiconductor memory device. More specifically, the present invention relates to a technique for driving a word line.

2. Description of the Related Art

In the field of a semiconductor memory device having a plurality of memory cells, a plurality of word lines and a plurality of bit lines, the following techniques are known as conventional techniques for driving the plurality of word lines, for example.

Japanese Laid-Open Patent Application (JP-A-Heisei, 7-169282) discloses a nonvolatile semiconductor memory device. In the nonvolatile semiconductor memory device, a circuit that drives a word line is constituted by an inverter circuit that includes an n-channel transistor and a p-channel transistor. A block select address signal generated from a first address signal group is supplied to a source line of each of the transistors. In addition, a gate select address signal generated from a second address signal group is supplied to a gate of each of the transistors.

Japanese Laid-Open Patent Application (JP-P2000-113689) discloses a row decoder used in a nonvolatile semiconductor memory device. The nonvolatile semiconductor memory device has a hierarchical word line structure and includes main word lines and local word lines. The row decoder includes a first transistor of PMOS type and a second transistor of NMOS type. One of conduction terminals of the first transistor is connected to a main word line, and the other is connected to a local word line. One of conduction terminals of the second transistor is connected to a local word line, and the other is connected to a ground power supply line.

FIG. 1 schematically shows a configuration of a conventional semiconductor memory device. In particular, FIG. 1 shows a configuration of a circuit for driving a word line. The semiconductor memory device has a hierarchical word line structure, namely, includes main-word lines and sub-word lines. An "SWD" (sub-word driver; sub-word decoder) 120 is a circuit for driving a corresponding sub-word line, and applies a driving voltage to the corresponding sub-word line. The driving voltage is supplied from an internal power supply circuit 130 to each SWD 120.

The internal power supply circuit 130 includes a read voltage generating circuit (RCP) 131, a write voltage generating circuit (ACP) 132, a plurality of first power supply switches (PWS_G) 160, and a plurality of second power supply switches (PWS_H) 170. The read voltage generating circuit 131 and the write voltage generating circuit 132 are charge pumps. The read voltage generating circuit 131 and the write voltage generating circuit 132 are connected to the plurality of first power supply switches 160_0 to 160_g. One first power supply switch 160_i (160_0 to 160_g) is connected to a plurality of second power supply switches 170_i0 to 170_ih through a first power supply interconnection VXPG_i. One second power supply switch 170_ij (170_i0-170_ih) is connected to one sub-word driver 120_ij through a second power supply interconnection VXPG_ij.

The read voltage generating circuit 131 and the write voltage generating circuit 132 supply respective of a read voltage VPRG and a write voltage VPPG to the plurality of first power supply switches 160_i. Each of the first power supply switches 160_i supplies a power supply voltage VCC, the read voltage VPRG and the write voltage VPPG to the first power supply interconnection VXPG_i in a standby state, a read operation and a write operation, respectively. The second power supply switches 170_ij supplies the voltage received through the first power supply interconnection VXPG_i to the second power supply interconnection VXPG_ij in response to a block address select signal. As a result, the read voltage VPRG or the write voltage VPPG is supplied as the driving voltage to the sub-word driver 120_ij connected to a selected memory cell block.

FIG. 2 is a circuit diagram showing a configuration of the sub-word driver (SWD) 120 according to the conventional technique. The sub-word driver 120 includes a level shifter 140 and a plurality of final stage drivers 150_0 to 150_k. The level shifter 140 includes P-channel transistors 141 and 142. Sources 141s and 142s of the respective P-channel transistors 141 and 142 are connected to the second power supply interconnection VXPG_ij. When a control signal MXCNT is turned on and the main-word line MX connected to the sub-word driver 120 is selected (is changed to Low level), a source voltage of the P-channel transistor 142 is output from the level shifter 140.

The plurality of final stage drivers 150_0 to 150_k, which are connected to a plurality of sub-word lines SX0 to SXk, drive the plurality of sub-word lines SX0 to SXk, respectively. More specifically, each of the final stage drivers 150_0 to 150_k includes transistors that constitute an inverter. Gates of the transistors are connected to any one of pre-word lines PX0 to PXk. Also, a source of a P-channel transistor 151 of the transistors is connected to the output of the level shifter 140. Therefore, when one of the pre-word lines PX0 to PXk is selected (is changed to Low level), a source voltage of a corresponding one P-channel transistor 151 is supplied to a corresponding sub-word line SX. Namely, the driving voltage (read voltage VPRG or write voltage VPPG) supplied from the second power supply interconnection VXPG_ij is applied to the selected sub-word line SX.

Also, the above-mentioned second power supply interconnection VXPG_ij is connected to back gates 141b and 142b of the respective P-channel transistors 141 and 142 of the level shifter 140, and to back gates 151b of the respective P-channel transistors 151 of the final stage drivers 150. More specifically, the voltage (read voltage VPRG or write voltage VPPG) of the second power supply interconnection VXPG_ij is applied to a well SWDPW in which those P-channel transistors 141, 142 and 151 are formed. In this manner, the sources (141s, 142s) and the back gates (141b, 142b) of the P-channel transistors 141 and 142 of the level shifter 140 are controlled by the same power supply line VXPG_ij.

FIG. 3 is a timing chart showing a word line driving operation performed by the above-mentioned semiconductor memory device. At time t0, the semiconductor memory device is powered, and a supply of power supply voltage VCC is started. Accordingly, the read voltage generating circuit 131 is activated to start supplying the read voltage VPRG. Thereafter, the first power supply switch PWS_G supplies the power supply voltage VCC to the first power supply interconnection VXPG_i, and the second power supply switch PWS_H supplies the ground voltage GND to the second power supply interconnection VXPG_ij. That is to say, in a standby state, the voltages of the sources and back gates of the P-channel transistors 141 and 142 in the sub-word driver 120 are maintained at the ground voltage GND.

A read access operation is as follows. At time t1, a chip select signal CS and a block address select signal ADD are input. The input signals are detected by an address transition detection circuit (not shown), and a power supply switch activation signal ATDX is enabled at time t2. Thereby, the first power supply switch (PWS_G) 160 and the second power supply switch (PWS_H) 170 associated with the selected memory cell block are activated. At time t3, the voltage of the first power supply interconnection VXPG_i starts rising to the read voltage VPRG. Accordingly, the voltage of the second power supply interconnection VXPG_ij starts rising to the read voltage VPRG. As a result, the sources 141s and 142s of the respective P-channel transistors 141 and 142 in the sub-word driver 120 and the well SWDPW are charged.

Then, in response to a word line select signal, the corresponding main-word line MX and pre-word line PX are driven to the Low level. As a result, the read voltage VPRG is output from the level shifter 140, and the read voltage (driving voltage) VPRG starts to be supplied to one sub-word line SX designated by the word line select signal. In the example shown in FIG. 3, the voltage of the designated sub-word line SX rises from the ground voltage GND to the read voltage VPRG from time t4 to time t5.

After that, at time t6, the input of the chip select signal CS and the block address select signal ADD is finished. The voltage of the second power supply interconnection VXPG_ij thereby starts falling from the read voltage VPRG to the ground voltage GND. In this case, the voltage of the well SWDPW that has been charged with the read voltage VPRG also starts falling to the ground voltage GND. At time t7, the voltage of the designated sub-word line SX starts falling, and then the driving of the sub-word line SX is finished.

SUMMARY OF THE INVENTION

There are problems with the conventional semiconductor memory device in the following points.

In the conventional semiconductor memory device, the second power supply interconnection VXPG_ij is connected to the sources 141s and 142s of the respective P-channel transistors 141 and 142 in the level shifter 140 and to the well SWDPW in which the P-channel transistors are formed. Namely, the sources 141s, 142s and the well SWDPW are controlled by the same power supply interconnection VXPG_ij. In the standby state, therefore, the voltages of the sources (141s and 142s) and the back gates (141b, 142b, and 151b) of the P-channel transistors in the sub word driver 120 are maintained at the ground voltage GND.

Such a configuration is advantageous in that power consumption during the standby state can be suppressed for the following reason. If a high voltage is applied to the back gates 141b, 142b and 151b of the P-channel transistors during the standby state, a minute sub-threshold current is carried. The inventors of the present invention, however, discovered the following disadvantages of the conventional technique.

According to the conventional configuration, it is necessary to charge and discharge the well SWDPW in which the P-channel transistors are formed every time the read access occurs. That is, when a certain sub-word line SX is driven, it is necessary not only to supply the read voltage VPRG to the sub-word line SX but also to raise the voltage of the well SWDPW from the ground voltage GND to the read voltage VPRG. In addition, after the access to the sub-word line SX is finished, it is necessary to drop the voltage of the well SWDPW from the read voltage VPRG to the ground voltage GND. A load capacity of the well SWDPW is quite large, and thus considerable power is consumed due to the load capacity.

If the power consumed by the charging and discharging of the load capacity of the well SWDPW is large, many charges accumulated in the read voltage generating circuit (charge pump) are consumed. Since an ability of the charge pump is limited, the voltage (read voltage VPRG) output from the charge pump falls particularly when the read accesses are successively performed. In the worst case, the read voltage VPRG applied to the sub-word line SX is too low to ensure a normal read operation. Moreover, in the case when the charge consumption is heavy, the charge pump operates continuously, which results in the increase of the power consumption of the charge pump. As described above, the conventional word line driving technique has a disadvantage in that the power consumption is high as a whole.

According to the present invention, a semiconductor memory device has: a word driver configured to apply a driving voltage to a word line connected to a memory cell; and an internal power supply circuit. The internal power supply circuit not only supplies the driving voltage to the word driver but also applies a substrate voltage to back gates of transistors included in the word driver. Here, the internal power supply circuit controls the driving voltage and the substrate voltage independently of each other. More specifically, in a read operation, the internal power supply circuit constantly supplies the substrate voltage, while turns on and off the supply of the driving voltage.

In the semiconductor memory device thus constructed, a voltage of the back gates of the transistors is settled down to a predetermined voltage before a read address transition. The predetermined voltage is a voltage which is applied to a word line that is selected in a read operation. On the other hand, the driving voltage for driving the word driver is settled down after the read address transition.

According to the semiconductor memory device of the present invention, a load capacity at the time of the read operation is reduced. More specifically, a load capacity of the well in which the transistors are formed is reduced. Therefore, an overall power consumption is reduced as compared with the conventional technique. Moreover, since the load capacity is reduced, time necessary for charging the word line is shortened and thus a word line driving speed is accelerated. In this manner, the present invention can realize both the reduction in the power consumption and the acceleration of the word line driving speed.

The semiconductor memory device, the word driver, and the internal power supply circuit according to the present invention can reduce the power consumption.

The semiconductor memory device, the word driver, and the internal power supply circuit according to the present invention can accelerate the word line driving speed.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the present embodiments illustrated for explanatory purposed.

The semiconductor memory device according to the present invention includes, for example, a dynamic random access memory (DRAM) or a nonvolatile semiconductor memory device such as a flash memory.

Figure 4:
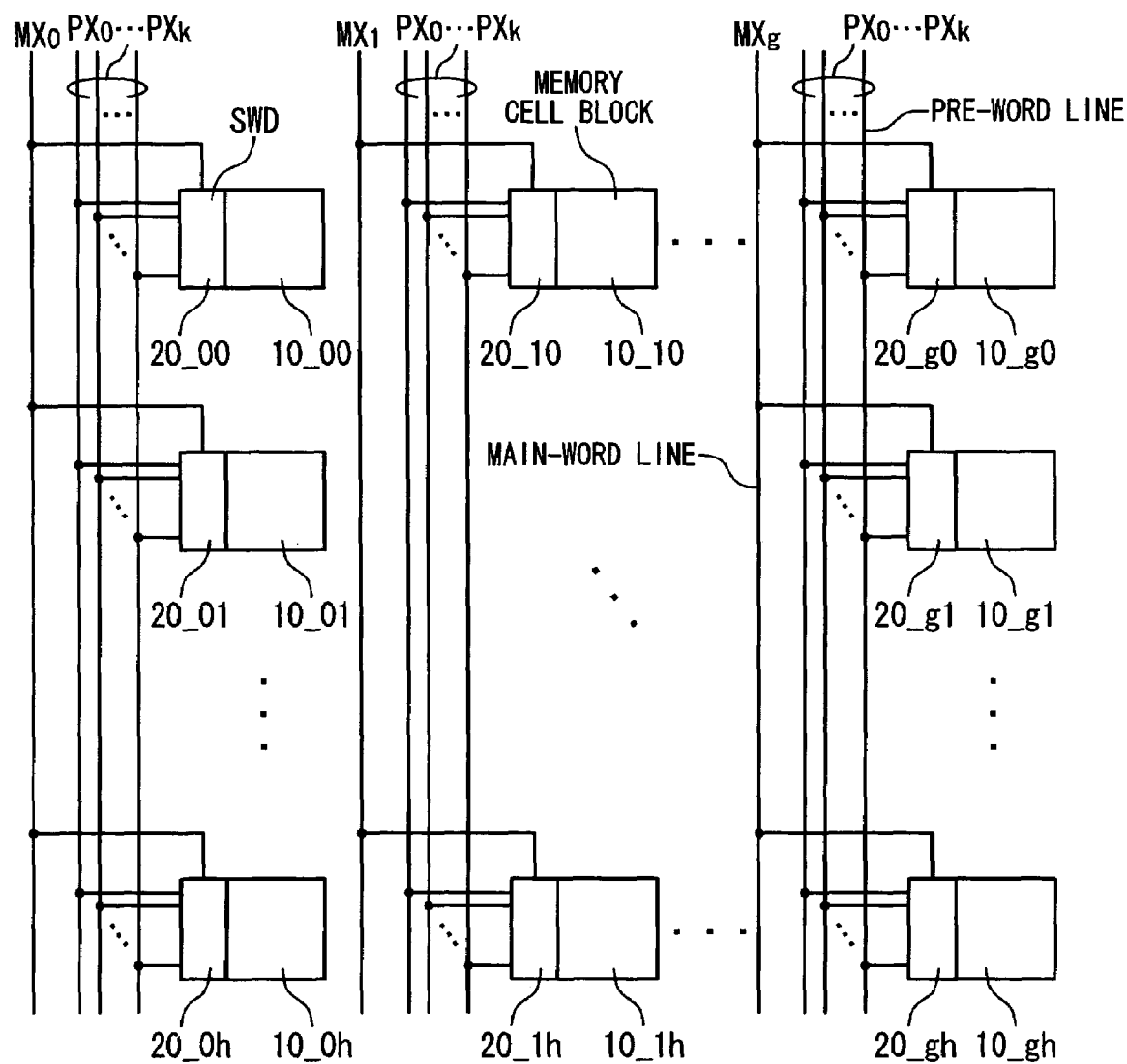
FIG. 4 is a block diagram schematically showing a configuration of a semiconductor memory device according to an embodiment of the present invention.

FIG. 4 conceptually shows a configuration of the semiconductor memory device 1 according to the present embodiment. The semiconductor memory device 1 includes a plurality of memory cell blocks 10 (10_ij, where $0 \leq i \leq g$ and $0 \leq j \leq h$) arranged in an array. Each memory cell block 10 includes a memory cell array consisting of a plurality of memory cells arranged in an array. One memory cell block is selected from the plurality of memory cell blocks 10 by a block address select signal. The block address select signal includes "a column block address select signal ADDG" for designating a column and "a row block address select signal ADDH" for designating a row. The selected memory cell block is activated, and a voltage is supplied to the activated memory cell block from an internal power supply circuit to be described later.

The semiconductor memory device 1 also includes a plurality of sub-word drivers (sub-word decoders; SWDs) 20. The plurality of sub-word drivers 20 (20_ij) are provided to correspond to the respective memory cell blocks 10 (10_ij). As described later in detail, each of these sub-word drivers 20 is a circuit for driving a word line connected to the memory cells in the corresponding memory cell block 10.

As shown in FIG. 4, the semiconductor memory device 1 has a hierarchical word line structure (hierarchical word line system). Namely, one main-word line MX (MX0 to MXg) is provided to correspond to a plurality of memory cell blocks 10. A main-word line MX1 is, for example, provided to correspond to memory cell blocks 10_10 to 10_1h arranged in a column direction. The main-word line MX1 is connected to the sub-word drivers 20_10 to 20_1h. When the main-word line MX1 is selected, the sub-word drivers 20_10 to 20_1h are activated.

Figure 5:
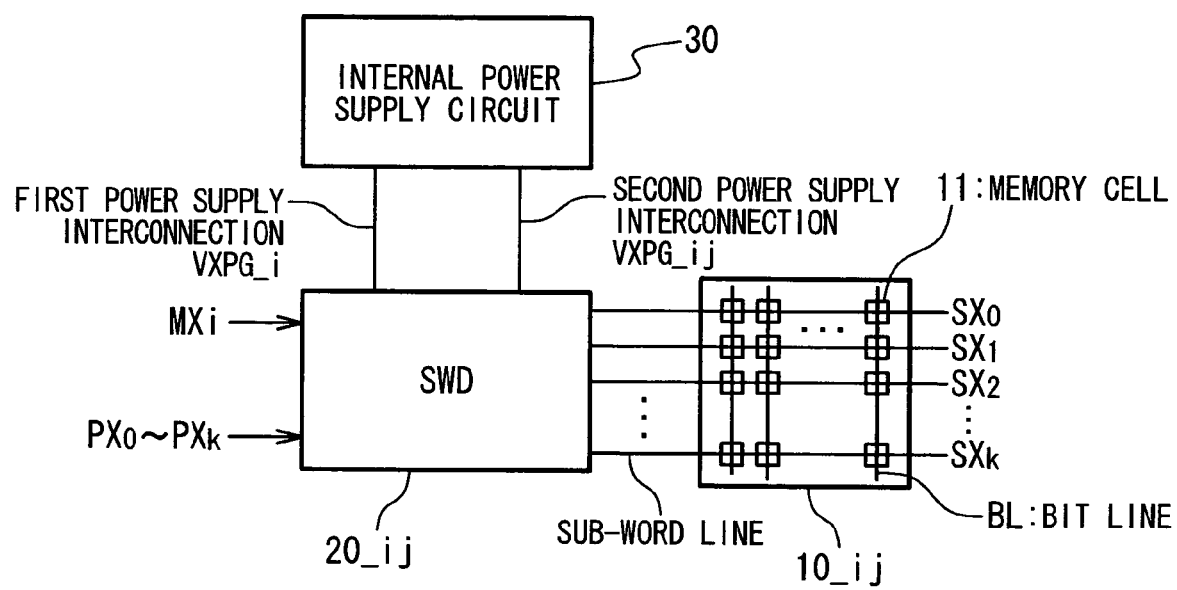
FIG. 5 is a block diagram schematically showing a configuration of the semiconductor memory device according to the present embodiment.

FIG. 5 is an explanatory view for a connection relationship between a certain memory cell block 10_ij and a certain sub-word driver 20_ij. As shown in FIG. 5, the memory cell block 10_ij includes one memory cell array. That is, the memory cell block 10_ij includes a plurality of memory cells 11 arranged in an array, a plurality of sub-word lines SX0 to SXk, and a plurality of bit lines BL. The plurality of sub-word lines SX0 to SXk intersect the plurality of bit lines BL each other, and the memory cells 11 are arranged at respective intersecting points. The memory cell 11 is, for example, a nonvolatile memory cell having a control gate and a floating gate.

The sub-word driver 20_ij is a circuit for driving the sub-word lines SX. The plurality of sub-word lines SX0 to SXk are connected to the sub-word driver 20_ij. As shown in FIGS. 4 and 5, a plurality of pre-word lines PX0 to PXk are connected to the sub-word driver 20_ij. The plurality of sub-word lines SX0 to SXk correspond to the plurality of pre-word lines PX0 to PXk, respectively. Namely, when one of the plurality of pre-word lines PX0 to PXk is selected by a word line select signal, one sub-word line SX corresponding to the selected one pre-word line PX is driven. A predetermined "driving voltage" is applied to the selected sub-word line SX by the sub-word driver 20_ij.

The "driving voltage" is supplied from an internal power supply circuit 30 to the sub-word driver 20_ij. The internal power supply circuit 30 is connected to the sub-word driver 20_ij through "a first power supply interconnection VXPG_i" and "a second power supply interconnection VXPG_ij". As mentioned above, the column block address select signal ADDG and the row block address select signal ADDH designate one of the plurality of memory cell blocks 10 which is activated (i.e., one memory cell block 10 including an access target memory cell). Based on these block address select signals ADDG and ADDH, the internal power supply circuit 30 supplies the driving voltage only to the sub-word driver 20_ij corresponding to the designated memory cell block 10_ij. Here, the "driving voltage" is supplied to the sub-word driver 20_ij through the "second power supply interconnection VXPG_ij" out of the above-mentioned two power supply interconnections. In other words, the second power supply interconnection VXPG_ij is an interconnection for the driving voltage applied to the sub-word line SX during a memory access.

On the other hand, the "first power supply interconnection VXPG_i" is connected to back gates of transistors that constitute the sub-word driver 20_ij. Namely, a voltage of the first power supply interconnection VXPG_i is applied to the back gates. In this context, the voltage of the first power supply interconnection VXPG_i is referred to as a "substrate voltage". The internal power supply circuit 30 controls the "substrate voltage" supplied to the first power supply interconnection VXPG_i independently of the "driving voltage" supplied to the above-mentioned second power supply interconnection VXPG_ij. More specifically, the internal power supply circuit 30 constantly supplies the "substrate voltage" to the first power supply interconnection VXPG_i. On the other hand, the internal power supply circuit 30 controls the supply of the "driving voltage" to the second power supply interconnection VXPG_ij to be turned on or off according to transition of access address (read address). Namely, in a read operation, the internal power supply circuit 30 turns on and off only supply of the "driving voltage" to the second power supply interconnection VXPG_ij while constantly supplying the "substrate voltage" to the first power supply interconnection VXPG_i.

Figure 6:
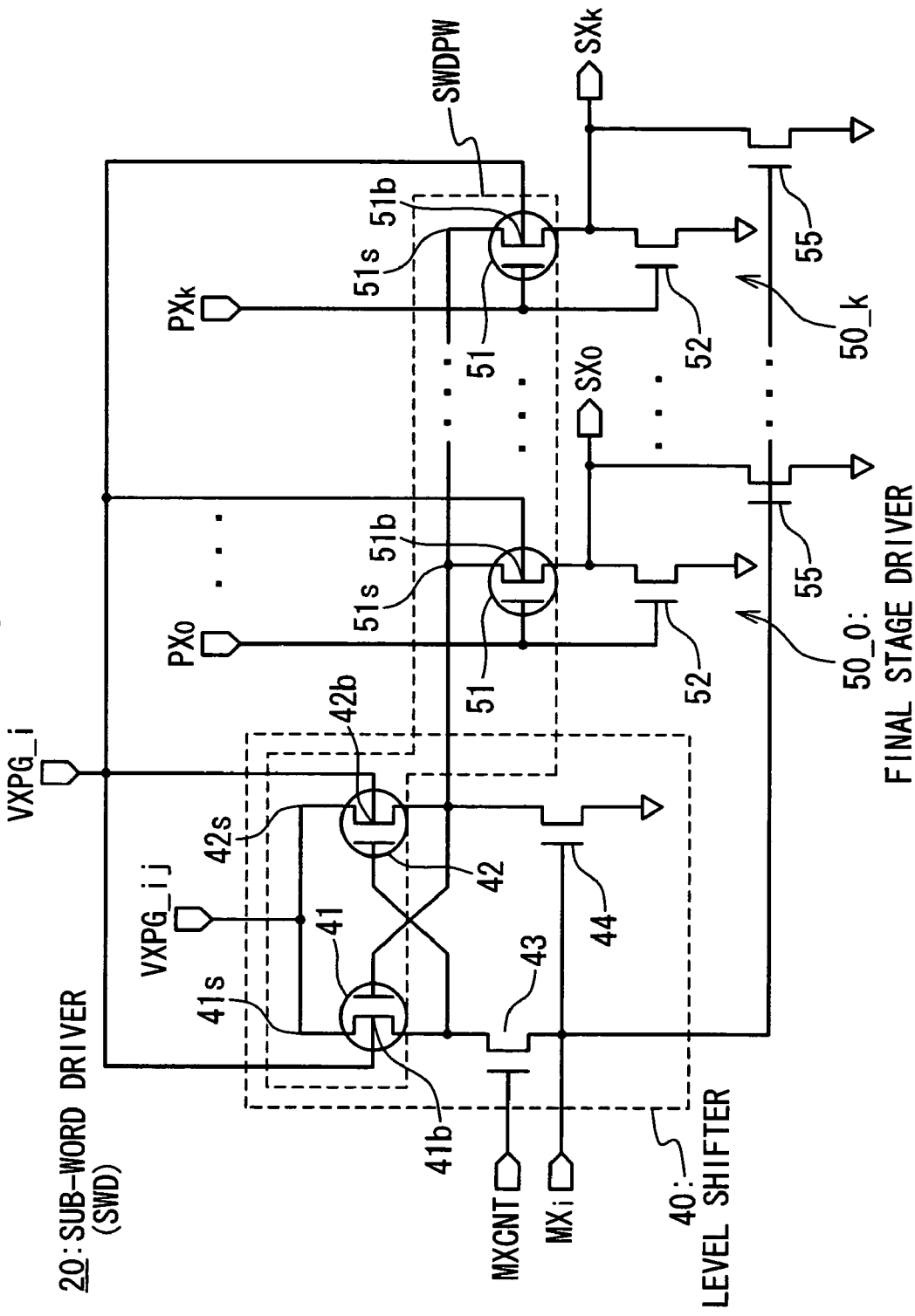
FIG. 6 is a circuit diagram showing a configuration of a sub-word driver according to the present embodiment.

FIG. 6 is a circuit diagram showing in detail a configuration of the sub-word driver (SWD) 20 according to the present embodiment. The sub-word driver 20 includes a level shifter 40 and a plurality of final stage drivers 50_0 to 50_k.

The level shifter 40 includes P-channel transistors 41 and 42 and N-channel transistors 43 and 44. According to the present embodiment, sources 41s and 42s of the respective P-channel transistors 41 and 42 are connected to the above-mentioned second power supply interconnection VXPG_ij. Back gates 41b and 42b of the respective P-channel transistors 41 and 42 are connected to the above-mentioned first power supply interconnection VXPG_i. The N-channel transistors 43 and 44 are connected to a certain main-word line MXi. A source of the N-channel 44 transistor is grounded.

The plurality of final stage drivers 50_0 to 50_k are connected to the plurality of sub-word lines SX0 to SXk and the plurality of pre-word lines PX0 to PXk, respectively. More specifically, each of the plurality of final stage drivers 50_0 to 50_k includes a P-channel transistor 51 and an N-channel transistor 52 that constitute an inverter. Gates of the P-channel transistor 51 and the N-channel transistor 52 are connected to corresponding one pre-word line PX. A source 51s of the P-channel transistor 51 is connected to an output of the level shifter 40, and a drain thereof is connected to corresponding one sub-word line SX. Further, a back gate 51b of the P-channel transistor 51 is connected to the above-mentioned first power supply interconnection VXPG_i. A source of the N channel transistor 52 is grounded, and a drain thereof is connected to the corresponding one sub-word line SX.

As describe above, according to the present embodiment, the back gates 41b, 42b, and 51b of the respective P-channel transistors 41, 42, and 51 included in the sub-word driver 20 are connected to the first power supply interconnection VXPG_i. The voltage of the first power supply interconnection VXPG_i is applied to a well SWDPW in which those P-channel transistors 41, 42, and 51 are formed. As mentioned above, the internal power supply circuit 30 constantly supplies the "substrate voltage" to the first power supply interconnection VXPG_i. On the other hand, the sources 41s and 42s of the P-channel transistors 41 and 42 are connected to the second power supply interconnection VXPG_ij. The internal power supply circuit 30 supplies the "driving voltage" to the second power supply interconnection VXPG_ij in response to the block address select signals ADDG and ADDH. In this manner, the voltage applied to the well SWDPW and the voltage applied to the sources 41s and 42s are controlled independently of each other.

In a standby state of the sub-word driver 20, the word line select signal is not input, and hence the voltages of the main-word line MXi and the pre-word lines PX0 to PXk are maintained at High level. In this case, the N-channel transistors 52 and 55 are turned on, and each sub-word line SX is maintained at a level of the ground voltage GND. Also, the output of the level shifter 40 is the ground voltage GND, and hence voltages of the sources 51s of the P-channel transistors 51 in the final stage drivers 50 are also kept at the ground voltage GND. In the standby state, the internal power supply circuit 30 supplies the ground voltage GND to the second power supply interconnection VXPG_ij, so that voltages of the sources 41s and 42s of the respective P-channel transistors 41 and 42 are maintained at the "ground voltage GND". On the other hand, the voltages of the back gates 41b, 42b, and 51b of the respective P-channel transistors 41, 42, and 51 are the "substrate voltage". The substrate voltage is different from the ground voltage GND. In the standby state, the well SWDPW is already charged with the substrate voltage. In the standby state, the back gates 41b, 42b, and 51b differ in state from the sources 41s and 42s.

In an access operation during which the sub-word driver 20 is activated, the internal power supply circuit 30 supplies the "driving voltage" to the second power supply interconnection VXPG_ij in response to the block address select signals ADDG and ADDH. In this case, the driving voltage is supplied to the sources 41s and 42s of the respective P-channel transistors 41 and 42. The "substrate voltage" is being supplied to the back gates 41b, 42b, and 51b of the respective P-channel transistors 41, 42, and 51 from the first power supply interconnection VXPG_i. That is, the voltages of the back gates 41b, 42b, and 51b remain unchanged between the standby state and the access operation (read operation).

Next, a word line control signal MXCNT (High level) is input to the level shifter 40. Also, a word line select signal designating the sub-word line SX to be driven (selected sub-word line SX) is input. In response to the word line select signal, the main-word line MXi connected to the sub-word driver 20 is selected (is changed to Low level), and any one of the plurality of pre-word lines PX0 to PXk is selected (is changed to Low level). As a result, the N-channel transistors 44 and 55 are turned off, and the N-channel transistor 43 and the P-channel transistor 42 are turned on.

Accordingly, the "driving voltage" which has been supplied to the source 42s of the P-channel transistor 42 is output from the level shifter 40. In the final stage driver 50 connected to the selected pre-word line PX, the N-channel transistor 52 is turned off and the P-channel transistor 51 is turned on. As a result, the driving voltage output from the level shifter 40 is applied to the selected sub-word line SX through the activated P-channel transistor 51. In the other final stage drivers 50, the N-channel transistor 52 remains in a turned-on state, and the voltage of the sub-word line SX is maintained at the ground voltage GND. In this manner, the "driving voltage" supplied from the second power supply interconnection VXPG_i is applied to the selected sub-word line SX during the access operation.

Next, a configuration of the internal power supply circuit 30 for realizing the above-mentioned voltage supply control will be described in detail.

Figure 7:
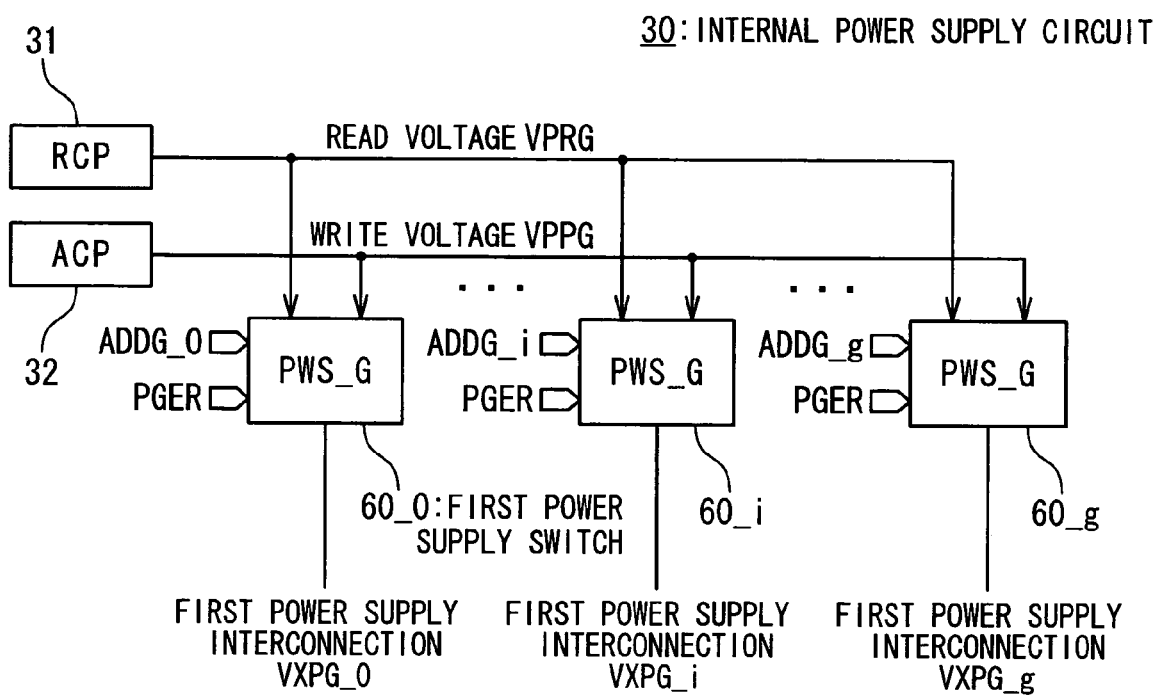
FIG. 7 is a block diagram showing a configuration of a part of an internal power supply circuit according to the present embodiment.

FIG. 7 is a block diagram showing a configuration of a part of the internal power supply circuit 30 according to the present embodiment. The internal power supply circuit 30 includes a read voltage generating circuit (RCP) 31, a write voltage generating circuit (ACP) 32, and a plurality of first power supply switches (PWS _G) 60. The read voltage generating circuit 31 and the write voltage generating circuit 32 are connected to the plurality of first power supply switches 60 (60_0 to 60_g). The read voltage generating circuit 31 and the write voltage generating circuit 32 are charge pumps, and supply a read voltage VPRG and a write voltage VPPG to the plurality of first power supply switches 60_i ($0 \leq i \leq g$), respectively. The read voltage VPRG is the "driving voltage" applied to the selected sub-word line SX during the read operation. The read voltage VPRG is 5 V, for example. The write voltage VPPG is the "driving voltage" applied to the selected sub-word line SX during the write operation. The write voltage VPPG is 9 V, for example.

The plurality of first power supply switches 60_0 to 60_g are connected to the plurality of first power supply interconnections VXPG_0 to VXPG_g, respectively. Each of the first power supply switches 60_i receives the read voltage VPRG and the write voltage VPPG, and outputs any one of them as a first voltage to the first power supply interconnection VXPG_i. Namely, the first power supply switch 60_i is a switching circuit for switching voltage between the two power supply voltages. More specifically, the first power supply switch 60_i receives a first block address select signal ADDG_i and a program-erase signal PGER. The first block address select signal ADDG_i is a signal (column block address select signal) for selecting memory cell blocks 10_i0 to 10_ih corresponding to one main-word line MXi from the plurality of memory cell blocks 10 arranged in an array. The first power supply switch 60_i switches voltage between the two power supply voltages based on the first block address select signal ADDG_i and the program-erase signal PGER.

Only when the program-erase signal PGER is input, the first power supply switch (PWS_G) 60_i outputs the write voltage VPPG to the first power supply interconnection VXPG_i. Otherwise, the first power supply switch 60_i outputs the read voltage VPRG to the first power supply interconnection VXPG_i. Namely, the first power supply switch 60_i "constantly" outputs either the read voltage VPRG or the write voltage VPPG. Each of the read voltage VPRG and the write voltage VPPG is not only the "driving voltage" applied to the selected sub-word line SX but also the "substrate voltage" which is supplied to the first power supply interconnection VXPG_I. As described above, the first power supply switch 60_i constantly supplies the substrate voltage to the first power supply interconnection VXPG_i.

Figure 8:
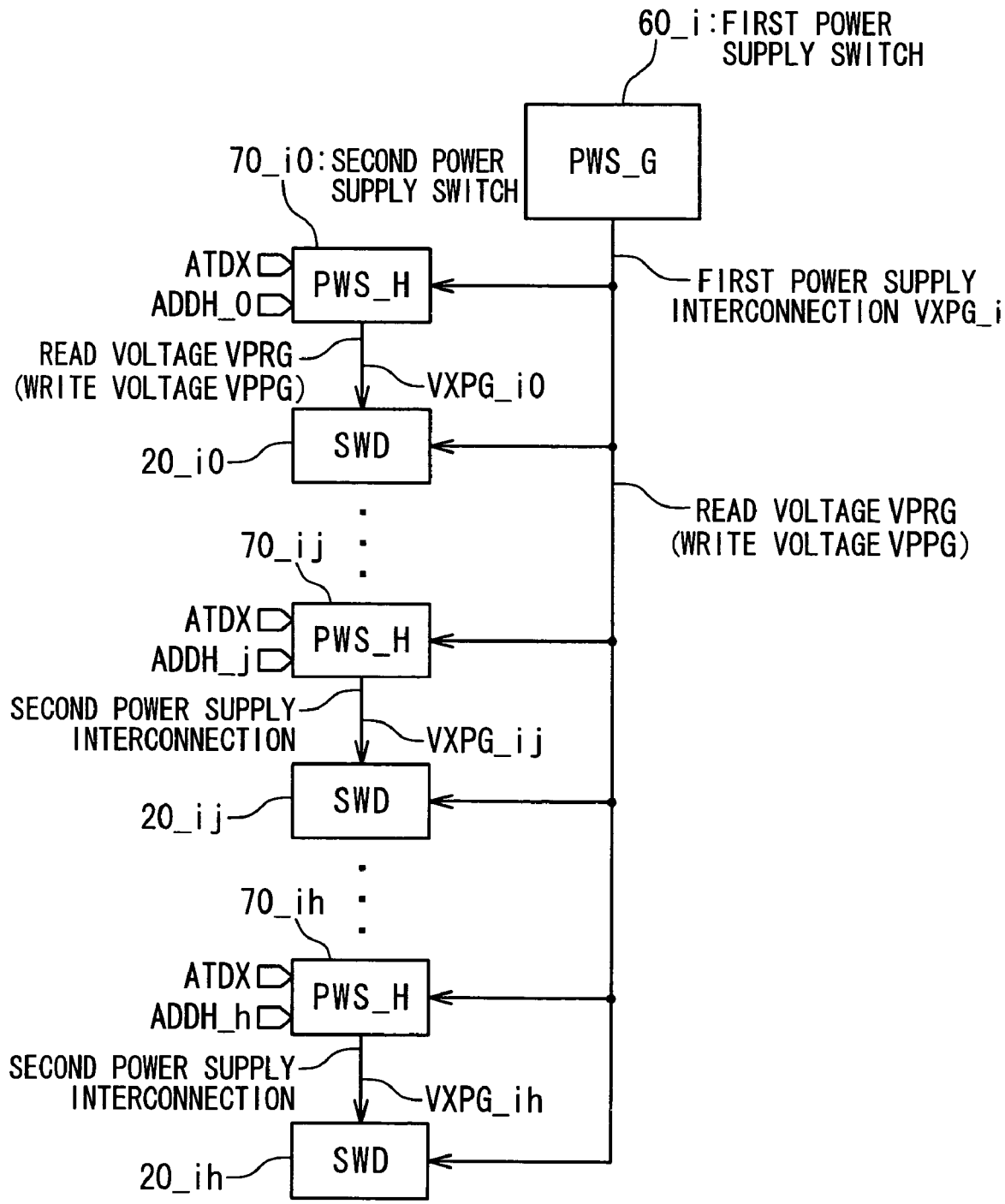
FIG. 8 is a block diagram showing a configuration of another part of the internal power supply circuit according to the present embodiment.

FIG. 8 is a block diagram showing a configuration of another part of the internal power supply circuit 30 according to the present embodiment. In FIG. 8, circuits connected to a certain first power supply switch 60_i among the plurality of first power supply switches 60 are shown.

As shown in FIG. 8, one first power supply switch 60_i, namely, one first power supply interconnection VXPG_i is connected to a plurality of sub-word drivers 20 in common. Here, the plurality of sub-word drivers 20 are a plurality of sub-word drivers 20_i0 to 20_ih arranged in a column direction and connected to one main-word line MXi. That is, the plurality of first power supply switches 60_0 to 60_g shown in FIG. 7 are provided to correspond to the respective main-word lines MX0 to MXg. As mentioned above, the first power supply interconnection VXPG_i is connected to the well SWDPW (see FIG. 6) in which the P-channel transistors 41, 42, and 51 in the sub-word driver 20 are formed. Thus, the first power supply switch 60_i constantly supplies the substrate voltage (the read voltage VPRG or the write voltage VPPG) to the well SWDPW.

Also, one first power supply switch 60_i, namely, one first power supply interconnection VXPG_i is connected to a plurality of second power supply switches (PWS_H) 70_i0 to 70_ih. The plurality of second power supply switches 70_i0 to 70_ih are connected to the above-mentioned sub-word drivers 20_i0 to 20_ih through a plurality of second power supply interconnections VXPG_i0 to VXPG_ih, respectively.

Each second power supply switch 70_ij (0≦i≦g, 0≦j≦h) constantly receives the "first voltage (the read voltage VPRG or the write voltage VPPG)" through the first power supply interconnection VXPG_i. The second supply switch 70_ij also outputs a "second voltage" to the second power supply interconnection VXPG_ij. The second voltage is the ground voltage or the first voltage received from the first power supply switch 60_i. That is to say, the second power supply switch 70_ij outputs either the ground voltage GND or the received first voltage (substrate voltage) to the second power supply interconnection VSPG_ij in response to predetermined control signals.

Figure 9:
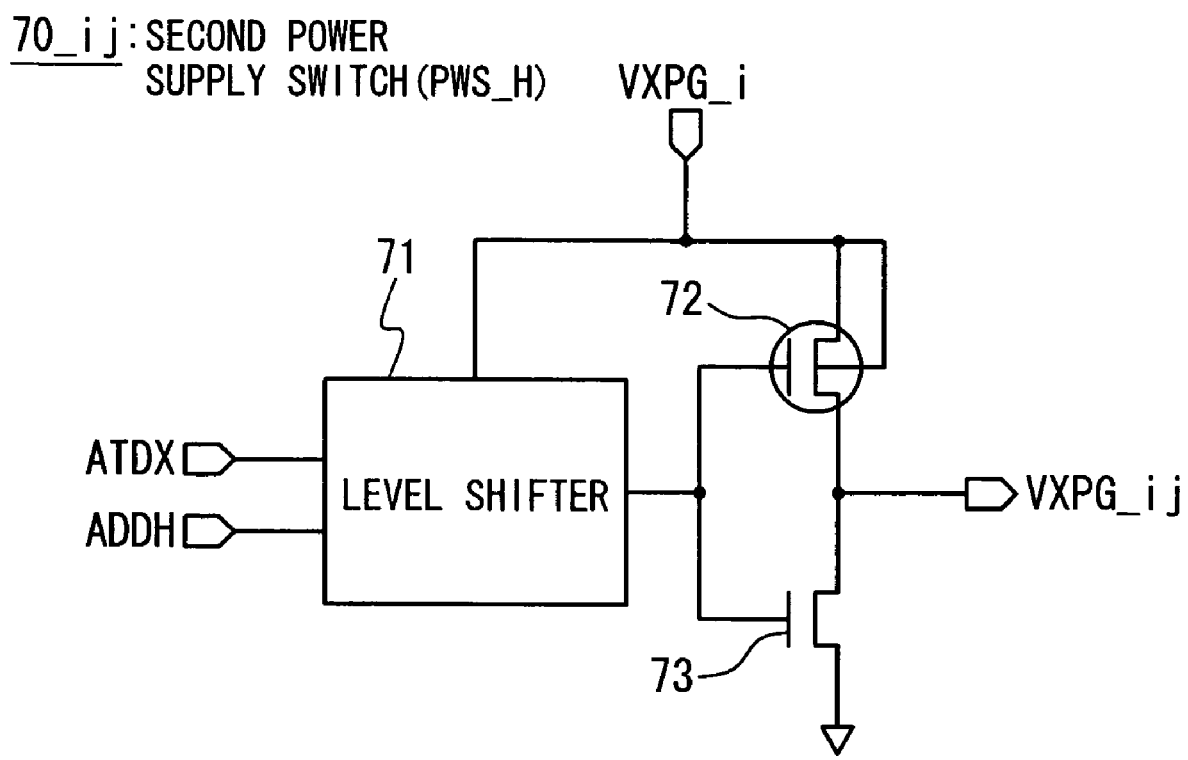
FIG. 9 is a circuit diagram showing a configuration of a second power supply switch according to the present embodiment.

FIG. 9 is a circuit diagram showing a configuration of the second power supply switch (PWS _H) 70 _ij. The second power supply switch 70_ij includes a level shifter 71, a P-channel transistor 72, and an N-channel transistor 73. The second power supply switch 70_ij receives a power supply switch activation signal ATDX and a second block select signal ADDH as the control signals. The second block address select signal ADDH is a signal (row block address select signal) for selecting a plurality of memory cell blocks 10_0j to 10_gj arranged in the row direction from the plurality of memory cell blocks 10 arranged in an array. Based on the second block address select signal ADDH_j, it is possible to designate one second power supply switch 70_ij among the plurality of second power supply switches 70_i0 to 70_ih shown in FIG. 8.

In the standby state, the P-channel transistor 72 is turned off, and the N channel transistor 73 is turned on. The ground voltage GND is thereby supplied to the second power supply interconnection VXPG_ij. At the time of the memory cell access operation, the power supply switch activation signal ATDX and the second block select signal ADDH are input to the level shifter 71. As a result, the P-channel transistor 72 is turned on, and the N-channel transistor 73 is turned off. The first voltage (substrate voltage) supplied from the first power supply interconnection VXPG_i is thereby supplied as the "driving voltage" to the second power supply interconnection VXPG_ij. In this manner, the second power supply switch 70_ij controls the output of the "driving voltage (the read voltage VPRG or the write voltage VPPG)" to be turned on and off based on the second block address select signal ADDH.

As mentioned above, the second power supply interconnection VXPG_ij connected to the second power supply switch 70_ij is connected to the source 41s and 42s of the respective P-channel transistors 41 and 42 in the sub-word driver 20_ij (see FIG. 6). The second voltage (the ground voltage GND or the driving voltage) output from the second power supply switch 70_ij is supplied to those sources 41s and 42s. That is, the second power supply switch 70_ij supplies the driving voltage (the read voltage VPRG or the write voltage VPPG) to the sources 41s and 42s through the second power supply interconnection VXPG_ij in response to the second block address select signal ADDH. As mentioned above, the driving voltage is applied to the selected sub-word line SX by the sub-word driver 20_ij.

According to the present embodiment, as described above, the internal power supply circuit 30 also has a "hierarchical" structure. One main-word line MXi is associated with one first power supply switch 60_i (one first power supply interconnection VXPG_i). The one first power supply switch 60_i is connected to a plurality of second power supply switches 70_i0 to 70_ih. The plurality of second power supply switches 70_i0 to 70_ih are connected to the plurality of sub-word drivers 20_i0 to 20_ih through the plurality of second power supply interconnections VXPG_i0 to VXPG_ih, respectively. According to the present embodiment, the first power supply interconnection VXPG_i is also connected to the plurality of sub-word drivers 20_i0 to 20_ih.

Figure 10:
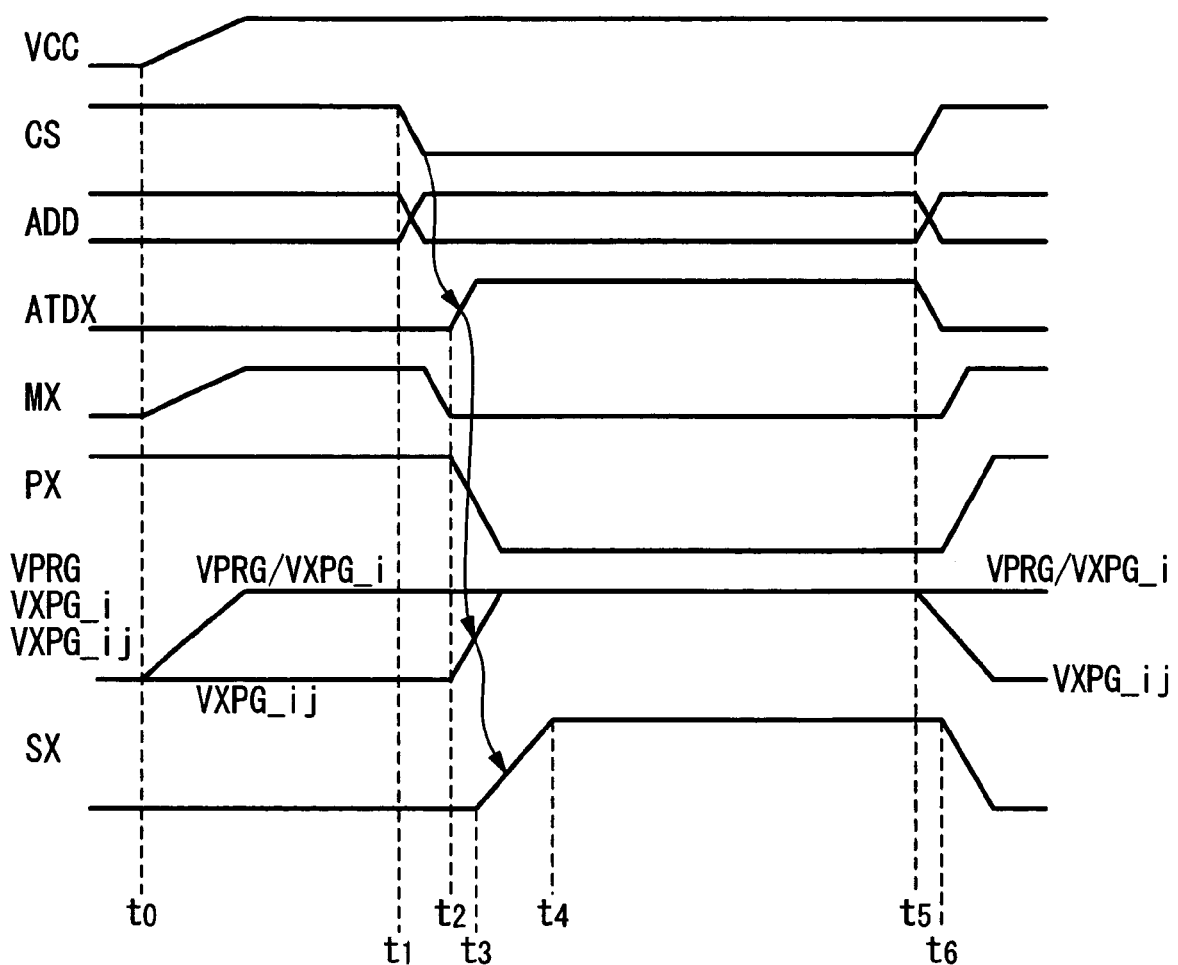
FIG. 10 is a timing chart showing a word line driving operation according to the present embodiment.

FIG. 10 is a timing chart showing a word line driving operation performed by the semiconductor memory device 1 according to the present embodiment. At time t0, the semiconductor memory device 1 is powered and supply of the power supply voltage VCC is started. Accordingly, the read voltage generating circuit 31 is activated to start supplying the read voltage VPRG. The first power supply switch 60_i thereby raises a voltage level of the first power supply interconnection VXPG_i to the "read voltage VPRG". The read voltage VPRG is supplied as the "substrate voltage" to the back gates 41b, 42b, and 51b of the P-channel transistors 41, 42, and 51 in the sub-word driver 20. That is, the well SWDPW starts to be charged with the read voltage VPRG (substrate voltage). The back gates 41b, 42b and 51b are preset to a voltage between the ground level GND and the read voltage VPRG. On the other hand, the second power supply switch 70_ij keeps a voltage level of the second power supply interconnection VXPG_ij at the ground voltage GND.

As describe above, in the standby state, the well SWDPW is charged with not the ground voltage GND but the "read voltage VPRG (substrate voltage)". The voltage of the well SWDPW is settled down and definitely set to the read voltage VPRG before transition of the read address. On the other hand, the voltage level of the sources 41s and 42s of the P-channel transistors 41 and 42 in the level shifter 40 is the ground voltage GND in the standby state.

A read access operation is as follows. At time t1, a chip select signal CS and the block address select signal ADD (ADDG and ADDH) are input. The chip select signal CS and the block address select signal ADD are detected by an address transition detection circuit (not shown), and the power supply switch activation signal ATDX is enabled at time t2. The second power supply switch (PWS_H) 70_ij corresponding to the selected memory cell block 10_ij is thereby activated (see FIG. 9). Accordingly, the read voltage VPRG (driving voltage) is applied to the second power supply interconnection VXPG_ij connected to the second power supply switch 70_ij. The sources 41s and 42s of the P-channel transistors 41 and 42 in the sub-word driver 20_ij start to be charged with the read voltage VPRG (driving voltage). The driving voltage of the sub-word driver 20_ij is settled down and definitely set after the transition of the read address.

Further, in response to a word line select signal, the corresponding main-word line MX and pre-word line PX are driven to Low level. The read voltage VPRG is thereby output from the level shifter 40, and the read voltage VPRG (driving voltage) is applied to the selected sub-word line SX designated by the word line select signal. In the example shown in FIG. 10, the voltage of the selected sub-word line SX rises from the ground voltage GND to the read voltage VPRG (driving voltage) from time t3 to time t4.

Thereafter, at time t5, the input of the chip select signal CS and the block address select signal ADD is finished. As a result, the voltage of the second power supply interconnection VXPG_ij starts falling from the read voltage VPRG to the ground voltage GND. At time t6, the voltage of the selected sub-word line SX also starts falling, and the driving of the selected sub-word line SX is finished. Here, the voltage of the first power supply interconnection VXPG_i is maintained at the read voltage VPRG (substrate voltage). Therefore, the voltages of the back gates 41b, 42b, and 51b of the P-channel transistors 41, 42, and 51 in the sub-word driver 20 are also maintained at the read voltage VPRG. That is to say, according to the present embodiment, the voltages of the back gates 41b, 42b, and 51b (the well SWDPW) remain unchanged during the read address transition.

It should be noted that in a write operation, the write voltage VPPG instead of the read voltage VPRG is supplied to the above-mentioned first power supply interconnection VXPG_i.

Figure 11:
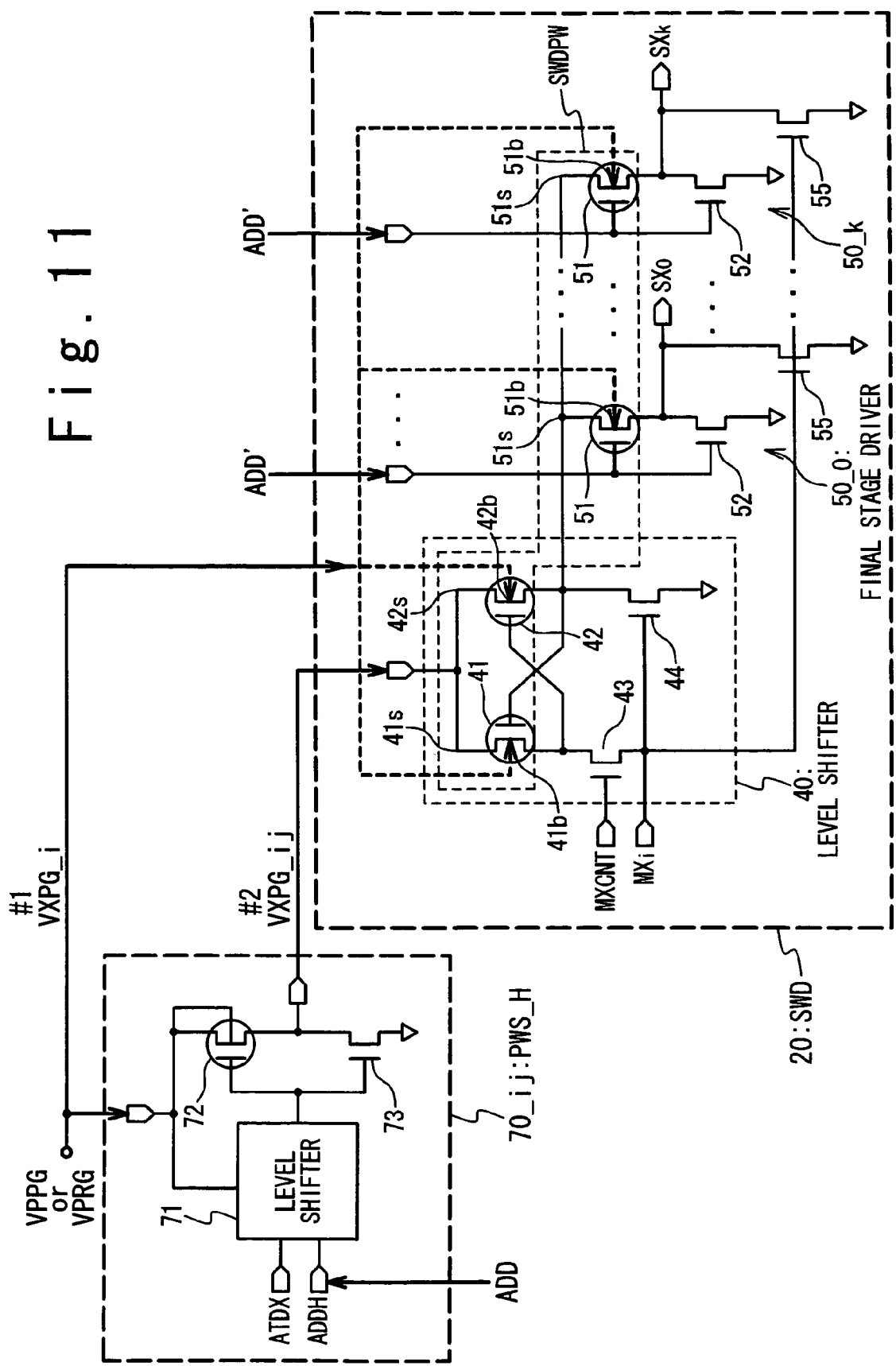
FIG. 11 is a circuit diagram for explaining a summary of the present embodiment.

FIG. 11 is a circuit diagram for explaining a summary of the present embodiment. With reference to FIG. 11, the present embodiment can be summarized as follows. The VXPG_i (the read voltage VPRG or the write voltage VPPG) is a global power supply and used as a first power supply in word decoder system. The VXPG_i as the first power supply is input to the PWS_H for every cell array. Then, an address signal ADD is input to the PWS_H. In response to the address signal ADD designating a cell array, the VXPG_ij as a second power supply is generated by the PWS_H and selectively output to the SWD of the designated cell array. In response to a predecorded address signal ADD', the SWD drives the word line. Without relation to the VXPG_ij, the global VXPG_i as the first power supply is directly input to the back gates of transistors in the SWD. That is, the first power supply VXPG_i for the substrate voltage and the second power supply VXPG_ij for driving the word line are controlled independently of each other.

Advantages attained by the semiconductor memory device 1, the sub-word driver 20 and the internal power supply circuit 30 mentioned above are as follows. The internal power supply circuit 30 supplies the substrate voltage (the voltage of the first power supply interconnection VXPG_i) and the driving voltage (the voltage of the second power supply interconnection VXPG_ij) to the sub-word driver 20 independently of each other. In particular, the internal power supply circuit 30 constantly supplies the substrate voltage to the first power supply interconnection VXPG_i. As a result, the well SWDPW in which the P-channel transistors in the sub-word driver 20 are formed is constantly set to the substrate voltage level and is always in a charged state. It is therefore unnecessary to charge and discharge the well SWDPW every time the access address transition occurs. Thus, the power consumption is reduced.

The load capacity viewed from the internal power supply circuit 30 is reduced by the load capacity of the well SWDPW which is quite large. Therefore, charges consumed by the charge pump (RCP 31) during one access are drastically reduced. Although the junction leakage during the standby state becomes slightly larger as compared with the conventional technique, the charges consumed during the access state are greatly reduced and thus the power consumption as a whole can be greatly reduced.

Figure 1:
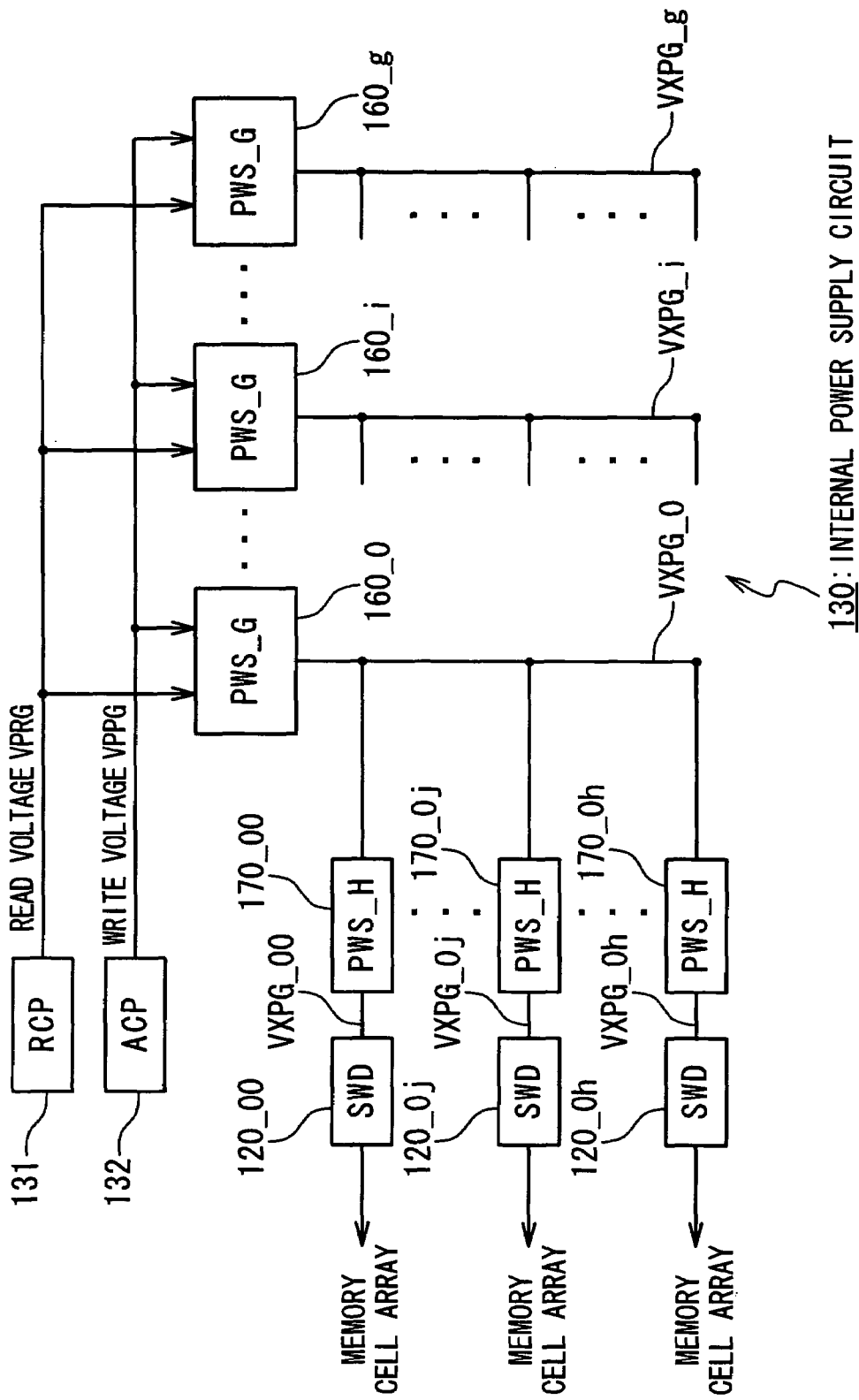
FIG. 1 is a block diagram schematically showing a configuration of a sub-word driver and an internal power supply circuit according to a conventional technique.
Figure 2:
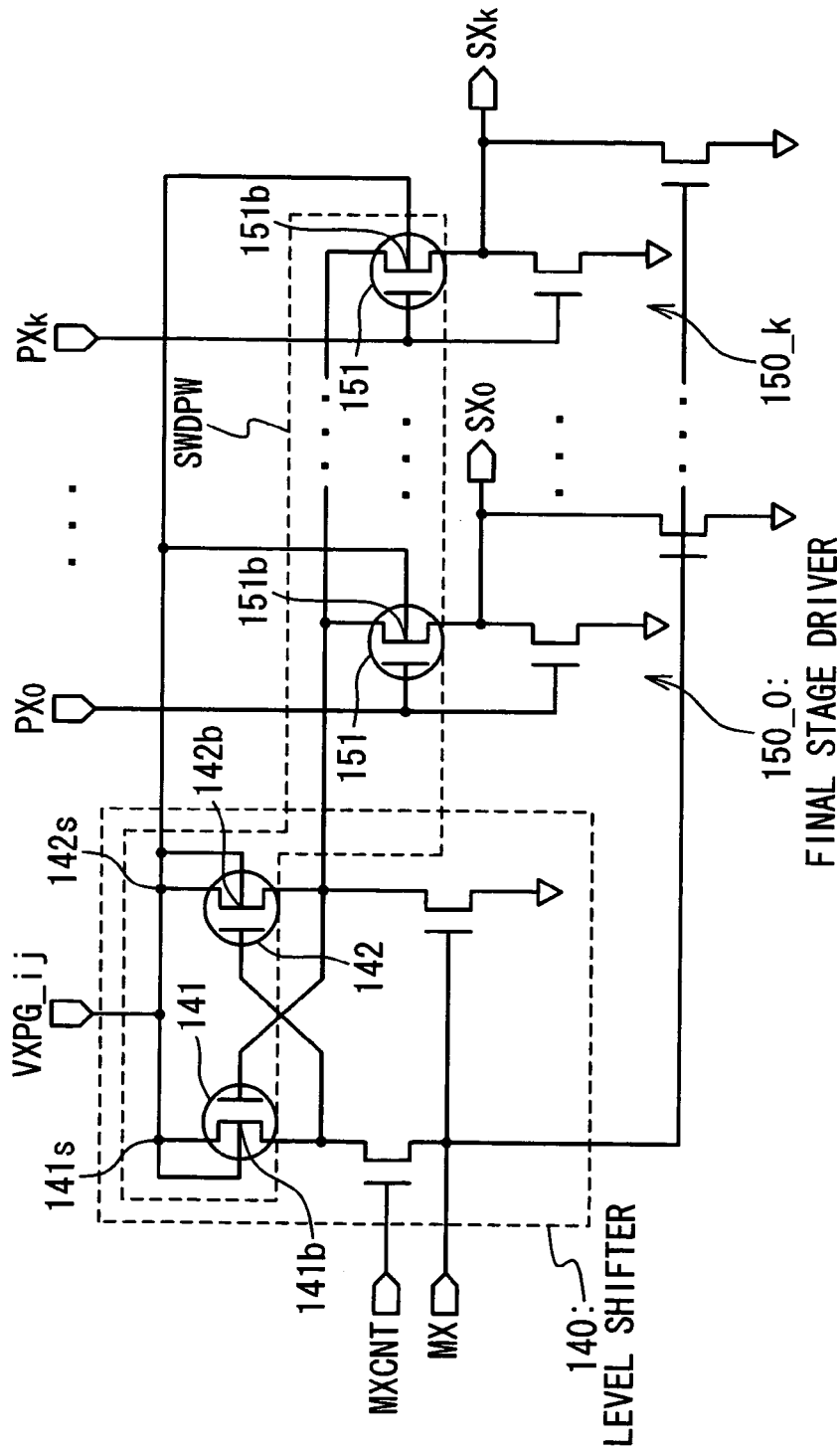
FIG. 2 is a circuit diagram showing a configuration of the sub-word driver according to the conventional technique.
Figure 3:
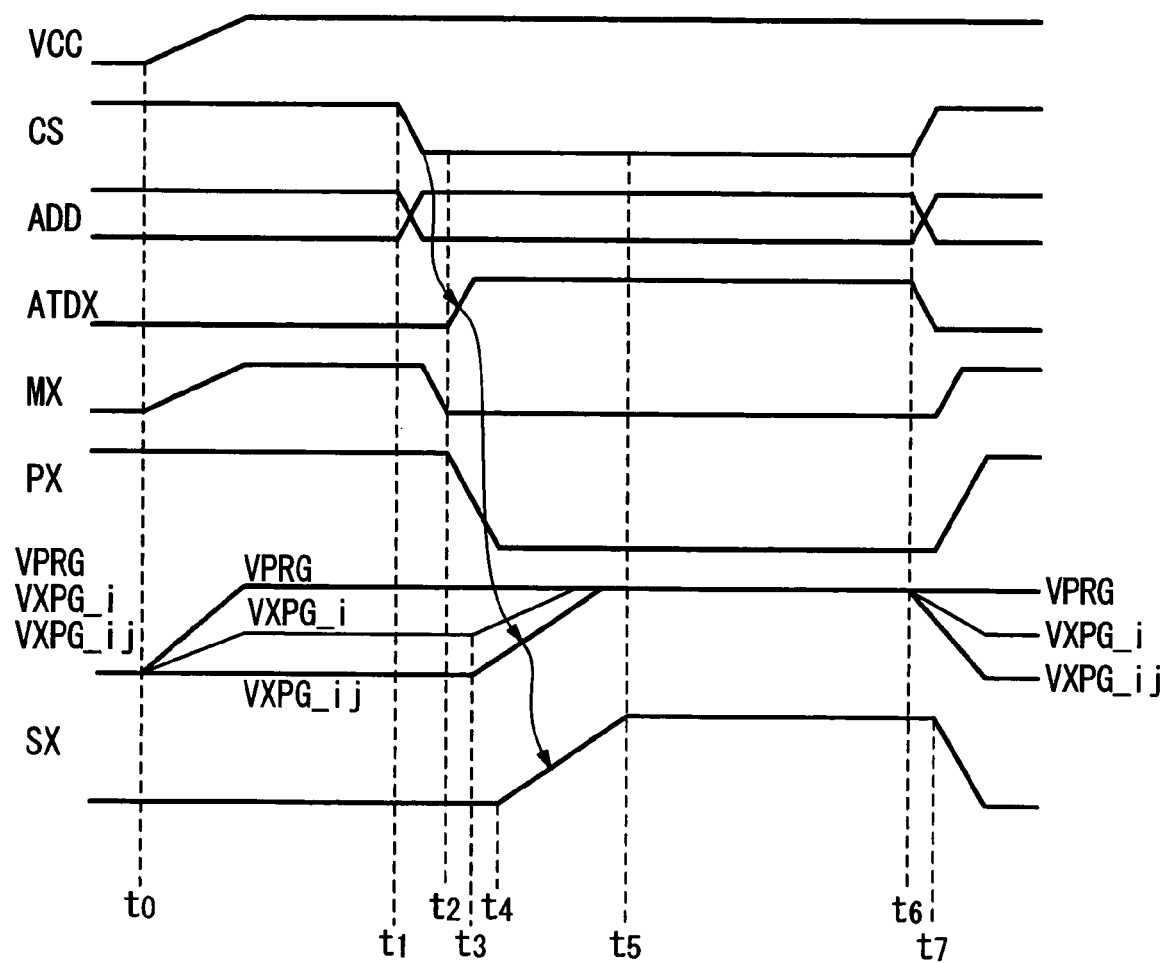
FIG. 3 is a timing chart showing a word line driving operation according to the conventional technique.

Furthermore, since the load capacity is reduced according to the present invention, time necessary for charging the second power supply interconnection VXPG_ij and the selected word line SX is shortened. For example, the charging time (t4-t3) in FIG. 10 for charging the selected word line SX becomes shorter than the charging time (t5-t4) in FIG. 3. In other words, the time for driving the sub-word line SX is shortened, and hence a word line driving speed is accelerated. As described above, the present invention can realize the reduction in the power consumption and the acceleration of the word line driving speed.

It is apparent that the present invention is not limited to the above embodiment, and that may be modified and changed without departing from the scope and spirit of the invention.

What is claimed is:

1. A semiconductor memory device comprising:

a word driver configured to apply a driving voltage to a word line connected to a memory cell; and an internal power supply circuit configured to supply said driving voltage to said word driver and to apply a substrate voltage to back gates of transistors included in said word driver, wherein said internal power supply circuit controls said driving voltage and said substrate voltage independently of each other, and wherein in a read operation, said internal power supply circuit constantly supplies said substrate voltage, while turning on and off supply of said driving voltage.

2. The semiconductor memory device according to claim 1, wherein said transistors include a P-channel transistor in a final stage for outputting said driving voltage to said word line.

3. The semiconductor memory device according to claim 2, wherein said internal power supply circuit comprises:
a first power supply switch connected to said word driver through a first power supply interconnection; and
a second power supply switch connected to said word driver through a second power supply interconnection,
wherein said first power supply switch constantly supplies said substrate voltage to said first power supply interconnection, and said second power supply switch supplies said driving voltage to said second power supply interconnection in response to a select signal.

4. The semiconductor memory device according to claim 1, wherein said memory cell comprises a non-volatile memory cell.

5. A semiconductor memory device comprising:
a word driver configured to apply a driving voltage to a word line connected to a memory cell; and
an internal power supply circuit configured to supply said driving voltage to said word driver and to apply a substrate voltage to back gates of transistors included in said word driver,
wherein said internal power supply circuit controls said driving voltage and said substrate voltage independently of each other, and
wherein said word driver includes a level shifter, and said transistors include a P-channel transistor of said level shifter.

6. The semiconductor memory device according to claim 5, wherein
said internal power supply circuit supplies said driving voltage to a source of said P-channel transistor of said level shifter and applies said substrate voltage to a well in which said P-channel transistor is formed, and
said word driver applies a voltage of said source to said word line in response to a word line select signal which designates said word line.

7. The semiconductor memory device according to claim 6, wherein said internal power supply circuit comprises:
a first power supply switch connected to said word driver through a first power supply interconnection; and
a second power supply switch connected to said word driver through a second power supply interconnection,
wherein said first power supply switch constantly supplies said substrate voltage to said first power supply interconnection, and said second power supply switch supplies said driving voltage to said second power supply interconnection in response to a select signal.

8. A semiconductor memory device comprising:
a word driver configured to apply a driving voltage to a word line connected to a memory cell; and
an internal power supply circuit configured to supply said driving voltage to said word driver and to apply a substrate voltage to back gates of transistors included in said word driver,
wherein said internal power supply circuit controls said driving voltage and said substrate voltage independently of each other, and
wherein said internal power supply circuit comprises:
a first power supply switch connected to said word driver through a first power supply interconnection; and
a second power supply switch connected to said word driver through a second power supply interconnection,
wherein said first power supply switch constantly supplies said substrate voltage to said first power supply interconnection, and said second power supply switch supplies said driving voltage to said second power supply interconnection in response to a select signal.

9. The semiconductor memory device according to claim 8, wherein said first power supply interconnection is connected with a plurality of second power supply switches each of which corresponds to said second power supply switch.

10. The semiconductor memory device according to claim 9, wherein
said first power supply interconnection is connected with a plurality of word drivers each of which corresponds to said word driver,
said plurality of word drivers are respectively connected to said plurality of second power supply switches,
said first power supply switch constantly supplies said substrate voltage to said plurality of word drivers through said first power supply interconnection,
each of said plurality of second power supply switches receives said substrate voltage constantly from said first power supply switch, and supplies said substrate voltage as said driving voltage to said second power supply interconnection in response to said select signal.

11. The semiconductor memory device according to claim 8, further comprising a plurality of memory cell blocks arranged in an array, wherein
said word driver is provided in each of said plurality of memory cell blocks, and
said select signal comprises a block select signal which designates a memory cell block of said plurality of memory cell blocks, said memory cell block including said memory cell to be accessed.

12. A semiconductor memory device comprising:
a word line connected to a memory cell; and
a word driver having a first transistor and a second transistor configured to drive said word line,
wherein said first transistor has a back gate to which a first voltage is applied before a read address transition, said first voltage being also applied to said word line when said word line is selected in a read operation, and
wherein said second transistor has a back gate to which a second voltage is applied before said read address transition, said second voltage being also applied to said word line when said word line is unselected in said read operation.

13. The semiconductor memory device according to claim 12, wherein a voltage for driving said word driver is settled down after said read address transition.

14. The semiconductor memory device according to claim 12, wherein said memory cell comprises a non-volatile memory cell.

15. The semiconductor memory device according to claim 12, wherein said voltage of back gates of transistors included in said word driver remains unchanged during said read address transition.

* * * * *